United States Patent
Bogi et al.

(10) Patent No.: US 11,239,842 B1
(45) Date of Patent: Feb. 1, 2022

(54) LEVEL DOWN SHIFTER

(71) Applicant: Arm Limited, Cambridge (GB)

(72) Inventors: Seshagiri Rao Bogi, Bangalore (IN);
Gayathri Gandhi, Bangalore (IN);
Vinay Chenani, Bangalore (IN);
Fabrice Blanc, Biot (FR)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/021,393

(22) Filed: Sep. 15, 2020

(30) Foreign Application Priority Data

Jul. 30, 2020 (IN) .............................. 202011032822

(51) Int. Cl.
*H03K 19/0185* (2006.01)
*H03K 3/356* (2006.01)
*H03K 19/17784* (2020.01)

(52) U.S. Cl.
CPC . *H03K 19/018521* (2013.01); *H03K 3/35613* (2013.01); *H03K 19/018514* (2013.01); *H03K 19/17784* (2013.01)

(58) Field of Classification Search
None
See application file for complete search history.

(56) References Cited

U.S. PATENT DOCUMENTS

| | | | |
|---|---|---|---|
| 7,808,294 B1 * | 10/2010 | Kottapalli | H03K 3/356113 327/333 |
| 9,647,660 B1 * | 5/2017 | Alam | H03K 3/356113 |
| 2013/0257505 A1 * | 10/2013 | Chiang | H03K 19/0185 327/333 |

* cited by examiner

*Primary Examiner* — Jany Richardson
(74) *Attorney, Agent, or Firm* — Quinn IP Law (57) ABSTRACT

A level down shifter circuit includes a latch and an assist circuit. The latch is configured to generate a digital shifted signal and a complementary shifted signal by a voltage downshift of a digital input signal and a complementary input signal. The digital input signal and the complementary input signal are in a first voltage domain. The digital shifted signal and the complementary shifted signal are in a second voltage domain. The second voltage domain has a smaller voltage range than the first voltage domain. The assist circuit is configured to alternately pull the digital shifted signal and the complementary shifted signal to an intermediate voltage in response to the digital input signal and the complementary input signal. The intermediate voltage is in the second voltage domain.

21 Claims, 6 Drawing Sheets

_Fig-1_

_Fig-2_

_Fig-9_

_Fig-10_

LEVEL DOWN SHIFTER

CROSS-REFERENCE TO RELATED APPLICATIONS

This application claims the benefit of India Provisional Application Number 2020/11032822, filed Jul. 30, 2020, which is hereby incorporated by reference in its entirety.

INTRODUCTION

Conventional core voltage domains have lower voltages than input/output voltage domains to provide for fast switching speeds and low power consumption in the cores while maintaining compatibility with external circuitry. Complementary metal-oxide-semiconductor based latch circuits are normally used to shift input signal voltages down from the input/output voltage domains to the core voltage domains. Latch circuit designs employ both p-channel field effect transistors and n-channel field effect transistors. However, the p-channel field effect transistors have low drain saturation currents relative to the n-channel field effects transistors of similar geometry. Combined with higher beta ratios of core devices relative to input/output devices, the latch circuits exhibit asymmetrical pull-up/pull-down performances. The pull-up performances often limit the speed at which the input signals are transferred into the core voltage domains. Increasing a size of the p-channel field effect transistors usually increases on-die area of the latch circuits and increases leakage currents.

SUMMARY

A level down shifter circuit is provided herein. The level down shifter circuit includes a latch and an assist circuit. The latch is configured to generate a digital shifted signal and a complementary shifted signal by a voltage downshift of a digital input signal and a complementary input signal. The digital input signal and the complementary input signal are in a first voltage domain. The digital shifted signal and the complementary shifted signal are in a second voltage domain. The second voltage domain has a smaller voltage range than the first voltage domain. The assist circuit is configured to alternately pull the digital shifted signal and the complementary shifted signal to an intermediate voltage in response to the digital input signal and the complementary input signal. The intermediate voltage is in the second voltage domain.

A method for level down shifting is provided herein. The method includes generating a digital shifted signal and a complementary shifted signal by downshifting voltages of a digital input signal and a complementary input signal using a circuit. The digital input signal and the complementary input signal are in a first voltage domain. The digital shifted signal and the complementary shifted signal are in a second voltage domain. The second voltage domain has a smaller voltage range than the first voltage domain. The method further includes alternately pulling the digital shifted signal and the complementary shifted signal to an intermediate voltage in response to the digital input signal and the complementary input signal. The intermediate voltage is in the second voltage domain.

A non-transitory computer readable storage medium storing a library cell defining a level down shifter circuit is provided herein. The level down shifter circuit includes a digital input node, a complementary input node, a digital output node, an intermediate node, a latch, and an assist circuit. The latch is coupled to the digital input node, the complementary input node, and the digital output node. The latch is configured to generate a digital shifted signal on the digital output node and a complementary shifted signal on a complementary shifted node by a voltage downshift of a digital input signal on the digital input node and a complementary input signal on the complementary input node. The digital input signal and the complementary input signal are in a first voltage domain. The digital shifted signal and the complementary shifted signal are in a second voltage domain. The second voltage domain has a smaller voltage range than the first voltage domain. The assist circuit is coupled to the digital input node, the complementary input node, the digital output node, and the complementary shifted node. The assist circuit is configured to alternately pull the digital shifted signal and the complementary shifted signal to an intermediate voltage on the intermediate node in response to the digital input signal and the complementary input signal. The intermediate voltage is in the second voltage domain.

The above features and advantages and other features and advantages of the present disclosure are readily apparent from the following detailed description of the best modes for carrying out the disclosure when taken in connection with the accompanying drawings.

DETAILED DESCRIPTION

Embodiments of the disclosure generally provide a voltage level down shifter circuit that supports multiple high voltage domains, provide high frequency performance, and/or work with super under drive core voltages. In various embodiments, the high voltage domains may range from approximately 2 volts direct current (Vdc) to approximately 1 Vdc. The core voltage domains generally range from approximately 1 Vdc to approximately 0.54 Vdc. A typical nominal core voltage domain may be 0.6 Vdc across process, voltage, and temperature (PVT). The voltage level down shifter circuit may be operational to transfer input signals at frequencies up to 250 megahertz (MHz) from the high voltage domains to the core voltage domains.

The voltage level down shifter circuit generally includes a "kick-start" device that enables the super under drive support (e.g., 0.6 Vdc nominal) with the high frequency performance (e.g., 200 MHz). The kick-start device includes high voltage domain n-channel field effect transistors (NFETs) and one or more high voltage domain header devices (e.g., resistors and/or transistors). Where used with core voltage domain p-channel field effect transistors (PFETs), the combination overcomes the high beta ratio differences, supports multiple high voltage domains, and allows for normal area PFET transistors. Various embodiments have robust electrostatic discharge protection according to planar semiconductor technology and silicon-on-insulator technology. The robust electrostatic discharge is achieved in part by avoiding direct coupling of the NFET transistors to the core voltage domain.

Figure 1:
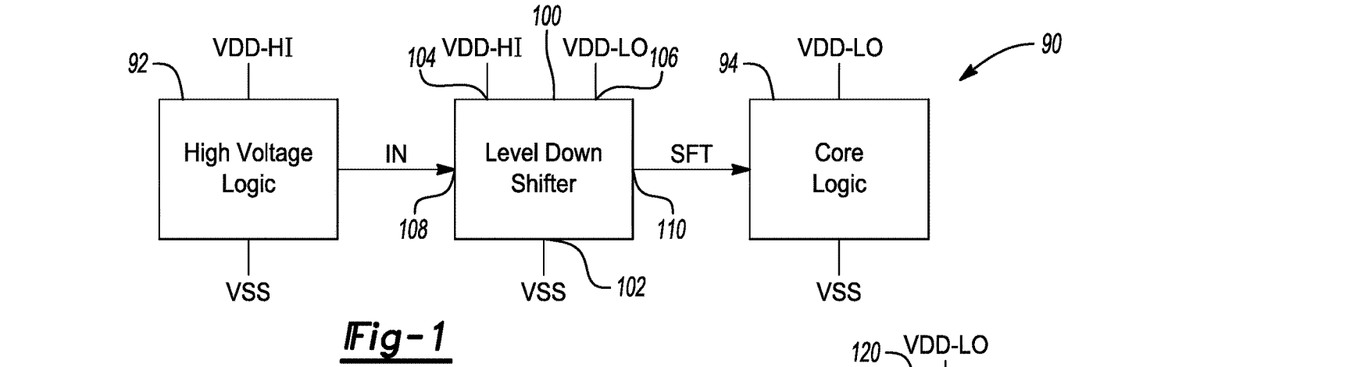
FIG. 1 is a schematic diagram of a system in accordance with an exemplary embodiment.

Referring to FIG. 1, a schematic diagram of an example implementation of a system 90 is shown in accordance with an exemplary embodiment. The system 90 may be implemented as part of a system-on-a-chip, an integrated circuit, a chip, and/or a die. The system 90 generally includes high voltage logic 92, core logic 94, and a level down shifter circuit 100. The level down shifter circuit 100 includes a reference voltage node 102, a high voltage node 104, a core voltage node 106, a digital input node 108, and a digital output node 110.

A high voltage domain of the system 90 is defined by a voltage difference between a high voltage (e.g., VDD-HI) and a reference voltage (e.g., VSS). The high voltage domain is also referred to as a first voltage domain. A voltage source of the high voltage VDD-HI may be referred to as a first voltage source. The first voltage source may typically operate around 1.2 Vdc to 1.8 Vdc. Other operating voltages may be implemented to meet the design criteria of a particular application. The first voltage domain generally refers to a high input voltage that is greater than and sometimes near to a core voltage in the core voltage domain.

The core voltage domain of the system 90 is defined by a voltage difference between a core voltage (e.g., VDD-LO) and the reference voltage VSS. The core voltage domain is also referred to as a second voltage domain. A voltage source of the core voltage VDD-LO may be referred to as a second voltage source. The second voltage source may typically operate around 0.6 Vdc to 1.0 Vdc. Other operating voltages may be implemented to meet the design criteria of a particular application.

The reference voltage VSS is coupled to the reference voltage node 102. The first voltage source of the high voltage VDD-HI is coupled to the high voltage node 104. The second voltage source of the core voltage VDD-LO is coupled to the core voltage node 106.

A digital input signal (e.g., IN) is received by the level down shifter circuit 100 at the digital input node 108 from the high voltage logic 92. The digital input signal IN operates in the first voltage domain (e.g., VDD-HI relative to VSS) and conveys information. A digital shifted signal (e.g., SFT) is presented from the digital output node 110 of the level down shifter circuit 100 to the core logic 94. The digital shifted signal SFT operates in the second voltage domain (e.g., VDD-LO relative to VSS) and conveys the information received in the digital input signal IN.

The system 90 may be, but is not limited to, automotive circuitry (e.g., automotive Internet-of-Things), server computers, cloud server computers, neural networks, communication networks, portable electronic devices, cellular telephones, digital cameras, and the like. The system 90 may be implemented wherever low core voltage domains are utilized. Other circuitry may implement the system 90 to meet a design criteria of a particular application.

The high voltage logic 92 is implemented as circuitry operating in the first voltage domain. A design of the high voltage logic 92 includes high voltage domain devices. The high voltage logic 92 is operational to generate the information, receive the information from elsewhere in the system 90, and/or receive the information from a source external to the system 90. In various embodiments, the high voltage logic 92 may include input/output circuitry, communication circuitry, converters, receivers, drivers, voltage level conversion circuitry and/or electrostatic discharge protection circuitry. The information within the high voltage logic 92 is presented to the level down shifter circuit 100 in the digital input signal IN.

The core logic 94 is implemented as digital circuitry. The core logic 94 operates in the second voltage domain and includes core voltage domain devices. The core logic 94 is configured to perform one or more operations based on the information received in the shifted digital shifted signal SFT. In various embodiments, the core logic 94 may include, but is not limited to, one or more processors, arithmetic logic units, storage circuits, encoders, decoders, processing devices, counters, encryption devices, decryption devices, and the like.

The level down shifter circuit 100 is implemented as an inter-voltage domain level down shifter. Operation of the level down shifter circuit 100 occurs in both the first voltage domain and the second voltage domain. The level down shifter circuit 100 is operational to generate the digital shifted signal SFT and the complementary shifted signal SFTB by downshifting voltages of the digital input signal IN and the complementary input signal INB. The digital input signal IN and the complementary input signal INB are in the first voltage domain. The digital shifted signal SFT and the complementary shifted signal SFT are in the second voltage domain. The second voltage domain has a smaller voltage range (e.g., VDD-LO<VDD-HI) than the first voltage domain. The level down shifter circuit 100 is also operational to alternately pull the digital shifted signal SFT and the complementary shifted signal SFT to an intermediate voltage in response to the digital input signal IN and the complementary input signal INB. The intermediate voltage is in the second voltage domain.

Figure 2:
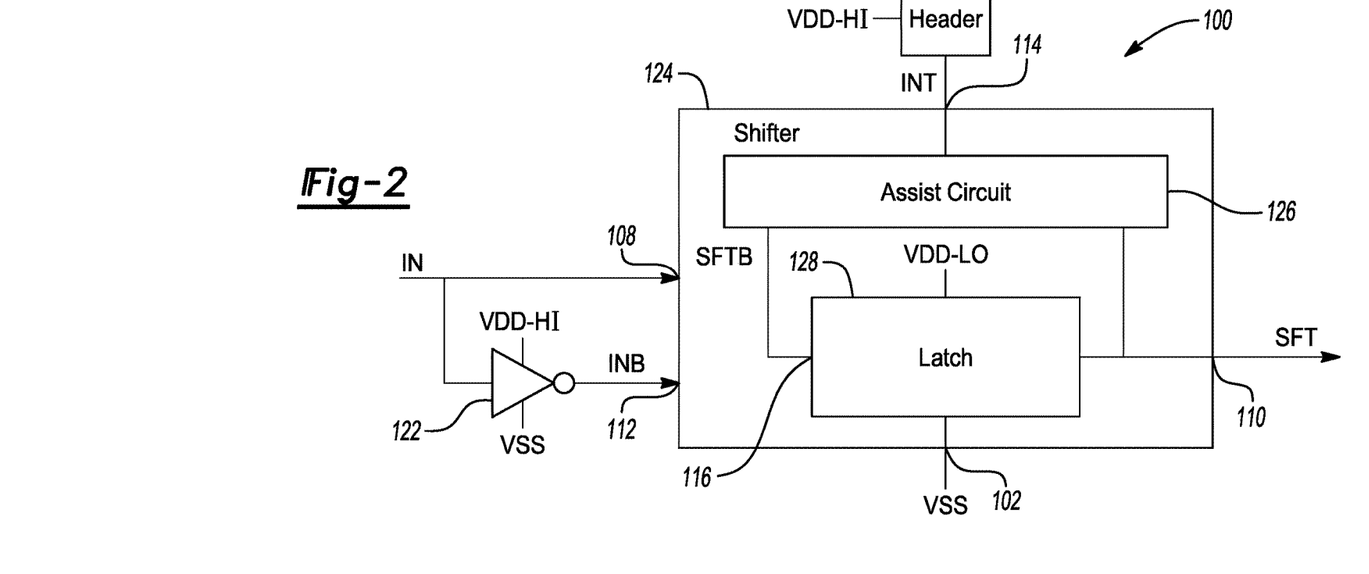
FIG. 2 is a schematic diagram of a level down shifter circuit in the system in accordance with an exemplary embodiment.

Referring to FIG. 2, a schematic diagram of an example implementation of the level down shifter circuit 100 is shown in accordance with an exemplary embodiment. The level down shifter circuit 100 includes a header 120, an inverter 122 and a shifter circuit 124. The shifter circuit 124 includes an assist circuit 126 and a latch 128.

The high voltage VDD-HI is coupled to the inverter 122 and optionally to the header 120. The core voltage VDD-LO is coupled to the header 120 and the latch 128. The reference voltage VSS is coupled to the inverter 122 and the latch 128.

The digital input signal IN is received at the digital input node 108 of the shifter circuit 124 and an input node of the inverter 122. A complementary input signal (INB) is generated by the inverter 122 and received at a complementary input node 112 of the shifter circuit 124. The complementary input signal INB carries a complementary version of the information in the digital input signal IN. An intermediate signal (INT) is generated by the header 120 and received at an intermediate node 114 of the shifter circuit 124. The intermediate signal INT provides an intermediate voltage to the assist circuit 126. The digital shifted signal SFT is presented at the digital output node 110 of the shifter circuit 124. A complementary shifted signal (SFTB) is generated by the assist circuit 126 and the latch 128 on a complementary shifted node 116. The complementary shifted signal SFTB conveys a complementary version of the information in the digital shifted signal SFT.

The header 120 is implemented as a passive device or an active device. The header 120 is operational to provide the intermediate voltage in the signal INT based on the core voltage VDD-LO and a current drawn by the shifter circuit 124. In embodiments where the header 120 is a passive device, the coupling to the high voltage VDD-HI may be eliminated. In embodiments where the header 120 is an active device, the high voltage VDD-HI may be coupled to the header 120.

The inverter 122 is implemented as a logical inverter circuit. The inverter 122 is operational to generate the complementary input signal INB in response to the digital input signal IN. In various embodiments, the inverter 122 may be implemented as a single-stage inverter. In other embodiments, the inverter 122 may be implemented as a multiple-stage inverter.

The shifter circuit 124 is implemented as a voltage-level down shifter circuit. The shifter circuit 124 includes multiple core voltage domain devices. The shifter circuit 124 is operational to generate the digital shifted signal SFT on the digital output node 110 and a complementary shifted signal SFTB on a complementary shifted node 116 by a voltage downshift of the digital input signal IN received on the digital input node 108 and the complementary input signal INB received on the complementary input node 112. The digital input signal IN and the complementary input signal INB are in the first voltage domain (e.g., VDD-HI relative to VSS). The digital shifted signal SFT and the complementary shifted signal SFTB are in the second voltage domain (e.g., VDD-LO relative to VSS). The second voltage domain has a smaller voltage range than the first voltage domain (e.g., VDD-LO<VDD-HI).

The assist circuit 126 is implemented as multiple high voltage domain devices. The assist circuit 126 may also be referred to as a kick-start circuit. The assist circuit 126 is coupled to the latch 128 through the digital shifted signal SFT at the digital output node 110. The assist circuit is also coupled to the latch 128 through the complementary shifted signal SFTB at the complementary shifted node 116. The intermediate signal INT couples the assist circuit 126 to the header 120 via the intermediate node 114. The assist circuit 126 is generally operational to improve a pull-up capability of the latch 128.

Figure 3:
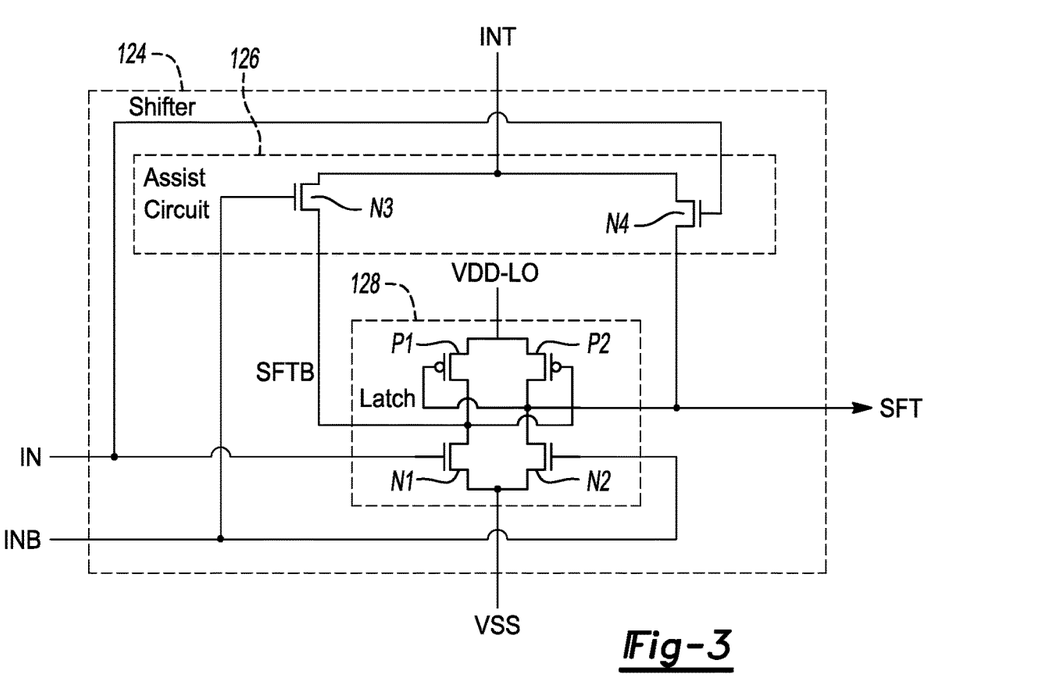
FIG. 3 is a schematic diagram of a shifter circuit in the level down shifter circuit in accordance with an exemplary embodiment.

Referring to FIG. 3, a schematic diagram of an example implementation of the shifter circuit 124 is shown in accordance with an exemplary embodiment. The assist circuit 126 includes a first pull-up transistor N3 and a second pull-up transistor N4. The latch 128 includes a third pull-up transistor P1, a fourth pull-up transistor P2, a first pull-down transistor N1, and a second pull-down transistor N2.

The first pull-up transistor N3 and the second pull-up transistor N4 are each implemented as high voltage domain NFET transistors. A gate of the first pull-up transistor N3 receives the complementary input signal INB. A gate of the second pull-up transistor N4 receives the digital input signal IN. While the digital input signal IN is at a logically high voltage level, the second pull-up transistor N4 is active and so pulls up the shifted output signal SFT. Simultaneously, the first pull-up transistor N3 is inactive and allows the complementary shifted signal SFTB to be pulled down by the latch 128. While the digital input signal IN is at a logically low voltage level, the first pull-up transistor N3 is active and so pulls up the complementary shifted signal SFTB. Simultaneously, the second pull-up transistor N4 is inactive and allows the digital shifted output signal SFT to be pulled low by the latch 128.

The first pull-down transistor N1 and the second pull-down transistor N2 are each implemented as high voltage domain NFET transistors. The third pull-up transistor P1 and the fourth pull-up transistor P2 are each implemented as core voltage domain PFET transistors. The pull-up transistors P1 and P2 are coupled to the pull-down transistors N1 and N2 as load transistors. The third pull-up transistor P1 and the first pull-down transistor N1 form a first inverter that generates the complementary shifted signal SFTB by inverting the digital input signal IN. The fourth pull-up transistor P2 and the second pull-down transistor N2 form a second inverter that generates the digital shifted signal SFT by inverting the complementary input signal INB.

The first inverter and the second inverter are cross coupled to implement a latch function. The two inverters in the latch 128 are coupled to the pull-up transistors N3 and N4 in the assist circuit 126 such that both the assist circuit 126 and the latch 128 together pull up the digital shifted signal SFT and the complementary shifted signal SFTB. The NFET pull-up transistors N3 and N4 in the assist circuit 126 improve the performance of the relatively weaker PFET pull-up transistors P1 and P2 in the latch 128. As a result, the performance of the level down shifter circuit 100 is improved relative to the performance of the latch 128 alone.

In various embodiments, the transistors N1, N2, N3, and N4 of the shifter circuit 124 may be implemented as thick-oxide n-channel metal-oxide-semiconductor (MOS) transistors. The transistors N1, N2, N3, and N4 are designed to operate in the first voltage domain to accommodate the relatively larger voltage swings of the digital input signal IN and the complementary input signal INB. In various embodiments, the pull-up transistors P1 and P2 may be implemented as thin-oxide p-channel MOS transistors. A threshold voltage of the pull-up transistors P1 and P2 may be slightly less than or match (e.g., approximate) the core voltage VDD-LO. The low differences between the threshold voltages of the pull-up transistors P1 and P2 and the core voltage VDD-LO may further reduce the ability of the pull-up transistors P1 and P2 to drive the digital shifted signal SFT and the complementary shifted signal SFTB to the logical high level of the core voltage domain. In other embodiments, the core voltage VDD-LO may be less than the threshold voltage of the pull-up transistors P1 and P2. In such situations, the pull-up transistors P1 and P2 would not switch to a conductive (e.g., active) state without the pull-up transistors N3 and N4 in the assist circuit 126.

Figure 4:
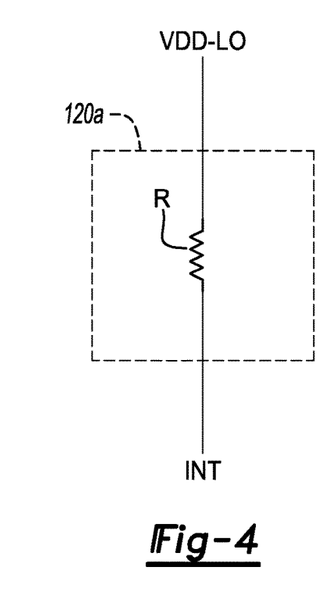
FIG. 4 is a schematic diagram of a header in the level down shifter circuit in accordance with an exemplary embodiment.

Referring to FIG. 4, a schematic diagram of an example implementation of a header 120a is shown in accordance with an exemplary embodiment. The header 120a may be suitable for use in the shifter circuit 124 as the header 120.

The header 120a may be implemented as one or more header (or load) resistors R. The header resistor R biases the intermediate voltage in the intermediate signal INT at the intermediate node 114 from the core voltage VDD-LO. The header resistor R generally provides a current limiting function that protects the shifter circuit 124 in the event of an electrostatic discharge event on the core voltage VDD- LO. The header resistor R is typically implemented where the level down shifter circuit 100 is fabricated on a planar semiconductor substrate.

Figure 5:
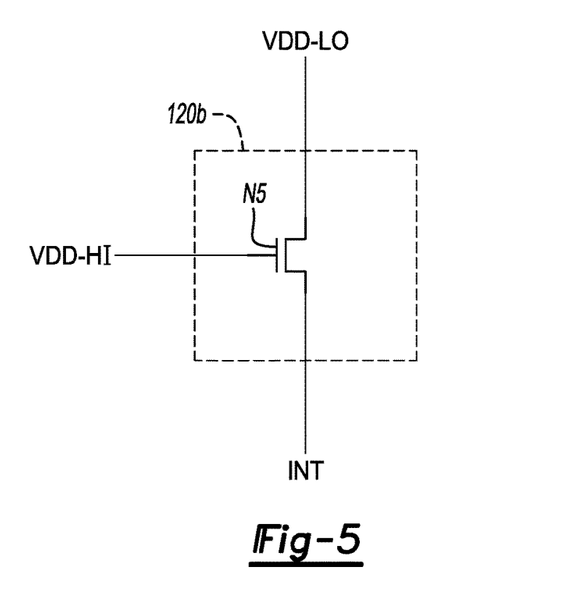
FIG. 5 is a schematic diagram of another header in the level down shifter circuit in accordance with an exemplary embodiment.

Referring to FIG. 5, a schematic diagram of an example implementation of a header 120b is shown in accordance with an exemplary embodiment. The header 120b may be suitable for use in the shifter circuit 124 as the header 120.

The header 120b may be implemented as one or more header (or load) transistors N5. In some embodiments, the header transistor N5 may be an n-channel field effect transistor. The header transistor N5 biases the intermediate voltage conveyed by the intermediate signal INT at the intermediate node 114 from the core voltage VDD-LO. The header transistor N5 generally provides a current limiting function that protects the shifter circuit 124 in the event of an electrostatic discharge event on the core voltage VDD-LO. The header transistor N5 is typically implemented where the level down shifter circuit 100 is fabricated on a silicon-on-insulator substrate.

Figure 6:
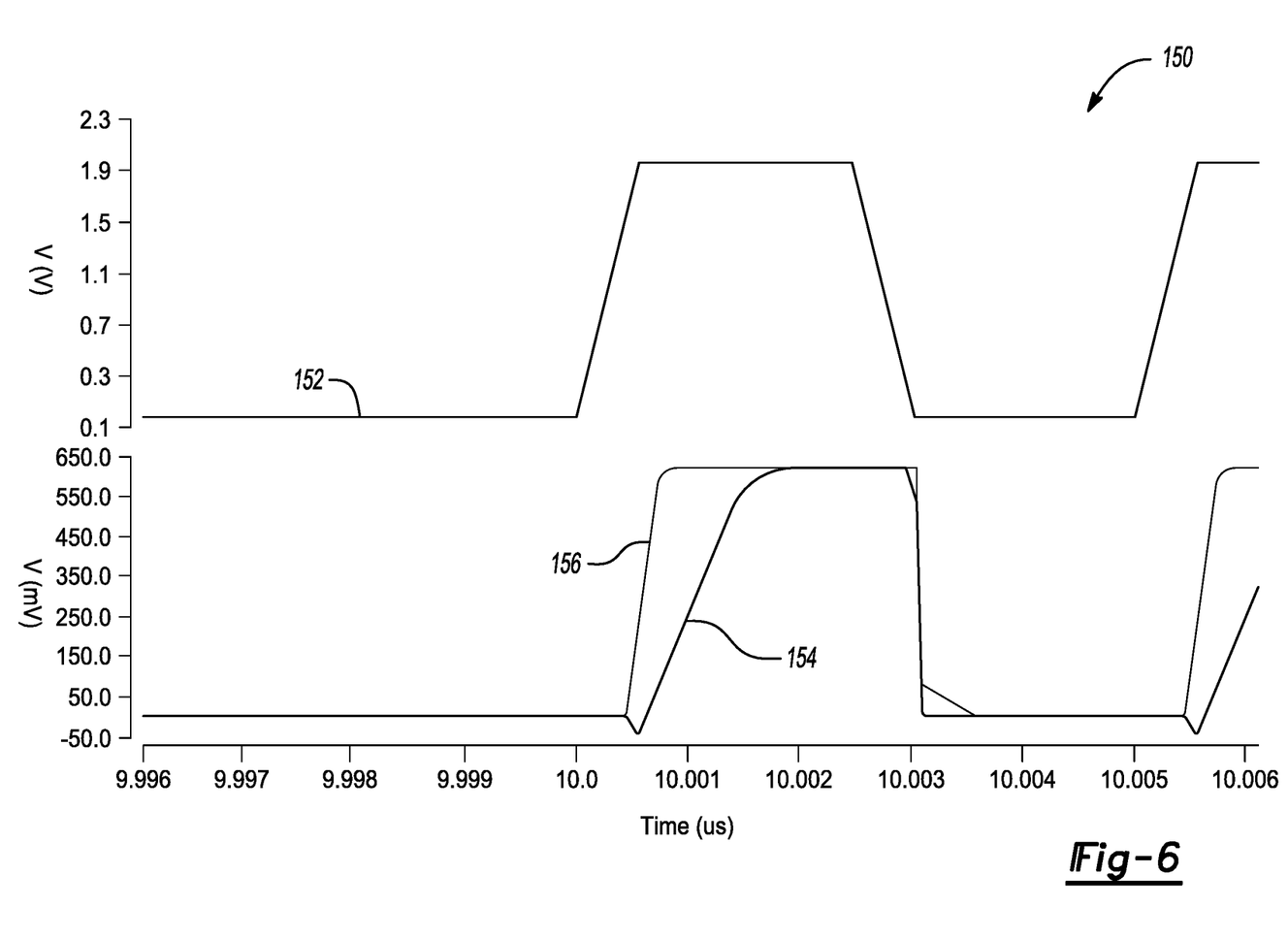
FIG. 6 is a graph of simulation results for the level down shifter circuit under a first set of conditions in accordance with an exemplary embodiment.

Referring to FIG. 6, a graph 150 of simulation results for the level down shifter circuit 100 under a first set of conditions is shown in accordance with an exemplary embodiment. An X axis of the graph 150 illustrates time in units of microseconds. A Y axis of the graph 150 illustrates voltages in units of volts (V) for the digital input signal IN, and millivolts (mV) for the digital shifted signal SFT. The first set of conditions includes the high voltage VDD-HI=1.98 Vdc, the core voltage VDD-LO=0.63 Vdc, the temperature=−40° C., the process corner=SSS, and the frequency of the digital input signal IN=200 MHz at a 50 femtoFarads (fF) load.

A curve 152 shows the digital input signal IN as a function of time. The curve 152 toggles between approximately 0.1 volts and approximately 1.9 volts. A curve 154 shows the digital shifted signal SFT in the absence of the assist circuit 126. The curve 154 is illustrated toggling between approximately 0 mV and approximately 630 mV. The curve 154 generally lags behind the digital input signal IN illustrated by the curve 152. In the absence of the assist circuit 126, the rise time of the curve 154 is slow relative to the rise time of the curve 152.

A curve 156 shows the digital shifted signal SFT with the assist circuit 126 incorporated into the shifter circuit 124. The curve 156 is illustrated toggling between approximately 0 mV and approximately 630 mV. The curves 152 and 156 show that the digital shifted signal SFT generally lags behind the digital input signal IN. A rise time of the curve 156 is faster than the rise time of the curve 154. Therefore, the rising edge of the curve 156 crosses from a core logical low voltage level to a core logical high voltage level faster than the curve 154. As such, a propagation delay of the level down shifter circuit 100 may be in a range of approximately 300 picoseconds (ps) to approximately 350 ps. The short propagation delay (e.g., approximately 337 ps) enables the level down shifter circuit 100 to down shift the voltage level in the digital input signal IN at high frequencies. The high frequencies may be in a range of approximately 10 MHz to approximately 250 MHz. The level down shifter circuit 100 may also operate when the digital input signal IN has lower frequencies of less than 10 MHz (e.g., down to 0 Hz).

Figure 7:
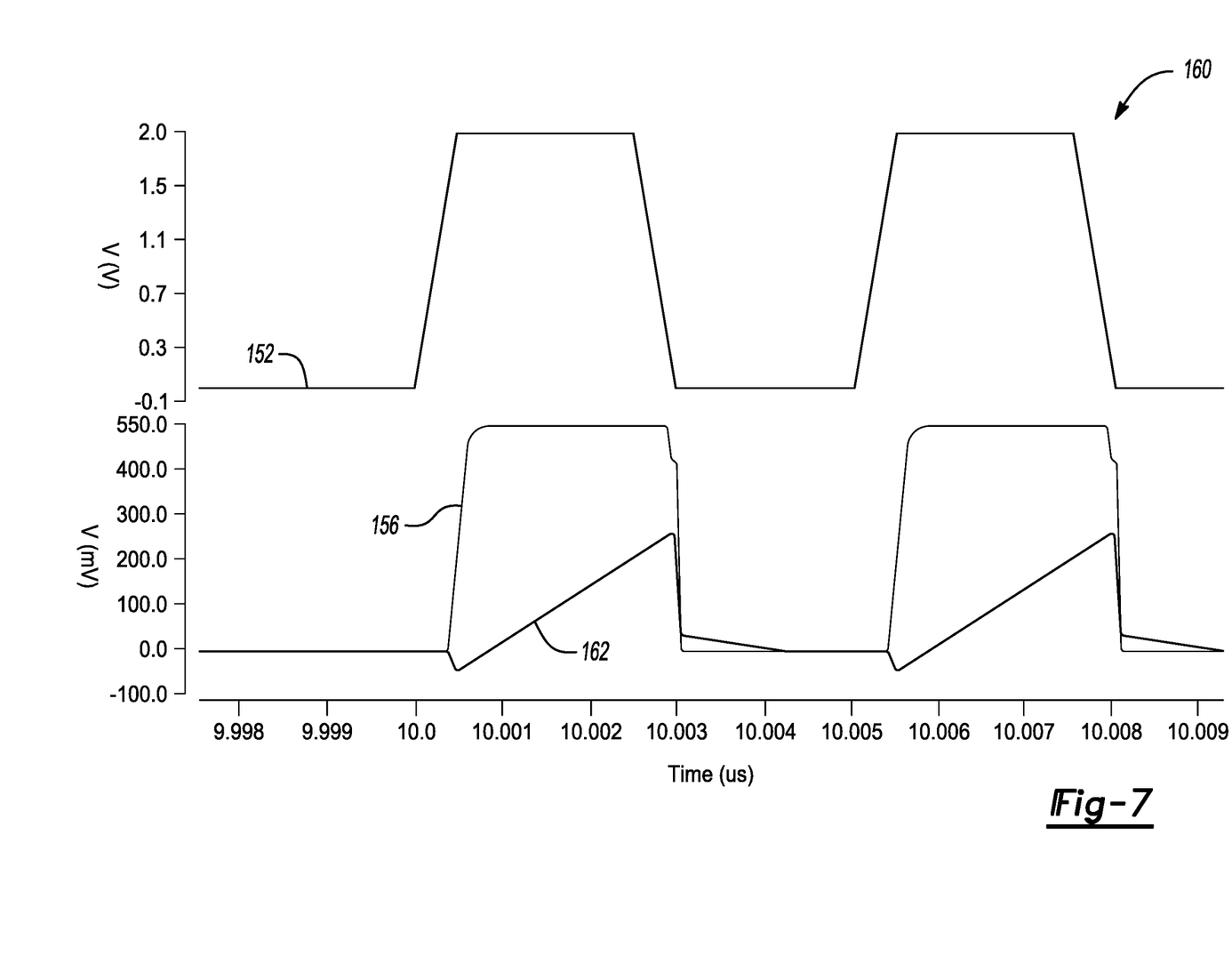
FIG. 7 is a graph of simulation results for the level down shifter circuit under a second set of conditions in accordance with an exemplary embodiment.

Referring to FIG. 7, a graph 160 of simulation results for the level down shifter circuit 100 under a second set of conditions is shown in accordance with an exemplary embodiment. An X axis of the graph 160 illustrates time in units of microseconds. A Y axis of the graph 160 illustrates voltages in units of volts for the digital input signal IN and millivolts for the digital shifted signal SFT. The second set of conditions includes the high voltage VDD-HI=1.98 Vdc, the core voltage VDD-LO=0.54 Vdc, the temperature=−40° C., the process corner=SSS, and the frequency of the digital input signal IN=200 MHz at a 50 fF load.

The curve 152 shows the digital input signal IN as a function of time. The curve 152 toggles between approximately 0.1 volts and approximately 1.9 volts. The curve 156 shows the digital shifted signal SFT with the assist circuit 126 incorporated into the shifter circuit 124. The curve 156 is illustrated toggling between approximately 0 mV and approximately 540 mV. A curve 162 shows the digital shifted signal SFT in the absence of the assist circuit 126.

As the core voltage VDD-LO is lowered to a point slightly above the threshold voltage of the pull-up transistors P1 and P2, the ability of the pull-up transistors P1 and P2 to transfer drain current decreases. Therefore, the curve 162 may rise slowly relative to the curve 152 in FIG. 6. In some situations, the slower rise time of the curve 162 may fail to rise above the core logical high voltage level. Therefore, the core logic 94 (FIG. 1) may not sense short low-to-high-to-low pulses in the digital input signal IN.

Figure 8:
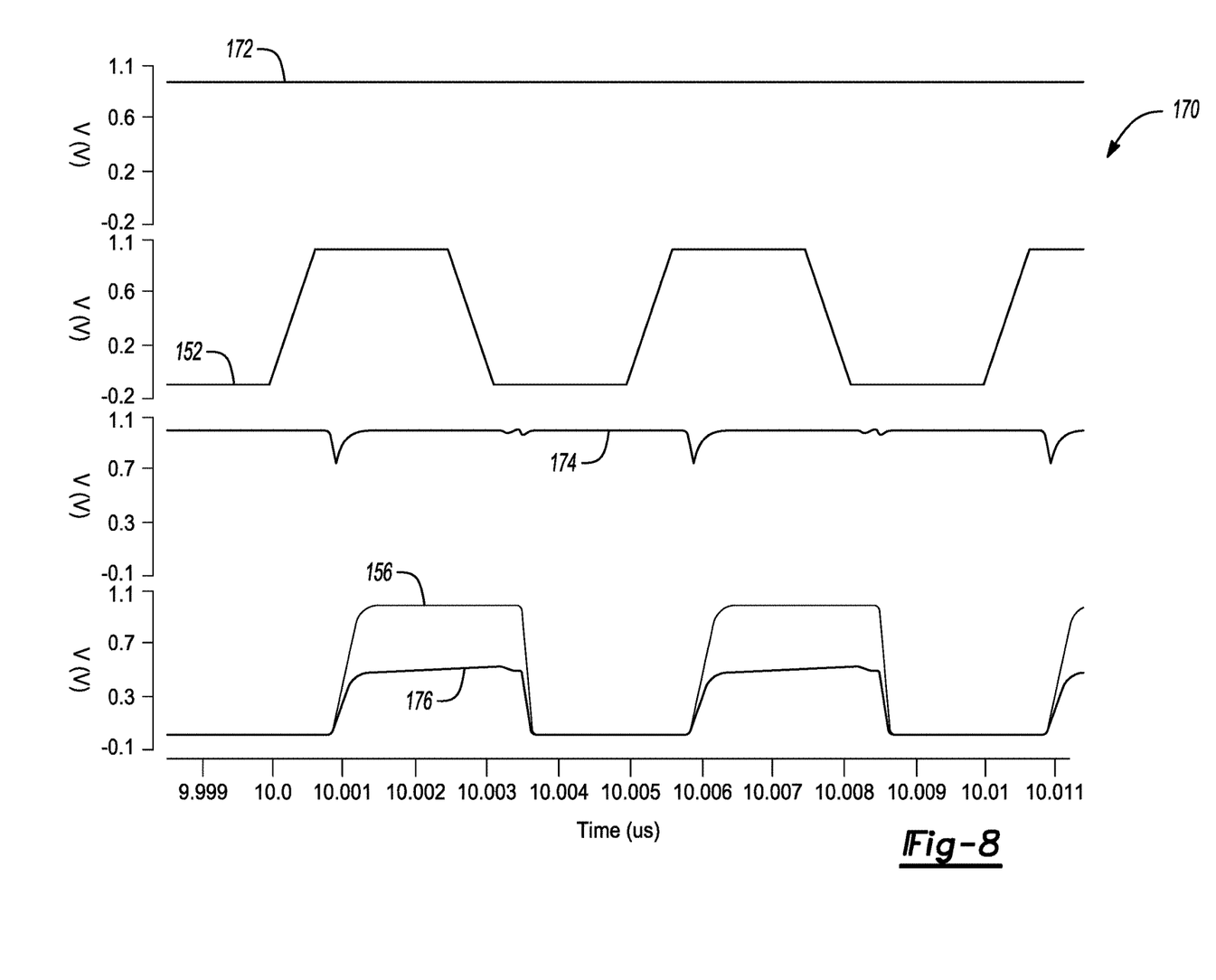
FIG. 8 is a graph of simulation results for the level down shifter circuit under a third set of conditions in accordance with an exemplary embodiment.

Referring to FIG. 8, a graph 170 of simulation results for the level down shifter circuit 100 under a third set of conditions is shown in accordance with an exemplary embodiment. An X axis of the graph 170 illustrates time in units of microseconds. A Y axis of the graph 170 illustrates voltages in units of volts for the core voltage VDD-LO, volts for the digital input signal IN, and volts for the digital shifted signal SFT. The third set of conditions includes the high voltage VDD-HI=1.08 Vdc, the core voltage VDD-LO=1 Vdc, the temperature=−40° C., the process corner=SSS, and the frequency of the digital input signal IN=200 MHz at a 50 fF load.

The curve 152 shows the digital input signal IN as a function of time. The curve 152 toggles between approximately 0 volts and approximately 1 volt. The curve 156 shows the digital shifted signal SFT with the assist circuit 126 incorporated into the shifter circuit 124. The curve 156 is illustrated toggling between approximately 0 volts and approximately 1 volt. A curve 172 shows the core voltage VDD-LO. A curve 174 shows the intermediate signal INT. A curve 176 shows the digital shifted signal SFT in the absence of the pull up transistors P1 and P2.

The curve 176 generally shows that in the absence of pull up transistors P1 and P2, when the core voltage VDD-LO and the high voltage VDD-HI are approximately the same, the digital shifted signal SFT does not achieve a full voltage swing of the core voltage VDD-LO. When the pull up transistors P1 and P2 are added along with the assist circuit 126, the ability of the pull-up transistors P1 and P2 allow the shifter circuit 124 to generate the digital shifted signal SFT while the VDD-LO and VDD-HI are almost at the same voltage level.

Table I generally illustrates estimated performances of the level down shifter circuit 100 compared with a common level shifter in response to a square wave in the digital input signal IN.

TABLE I

| Architecture | Delay through level down shifter circuit 100 | Duty Cycle Out (VDD-LO = 0.63 V to 1.0 V) | Duty Cycle Out (VDD-LO = 0.54 V to 1.0 V) |
| --- | --- | --- | --- |
| Common level shifter | 775 ps | 38%-58% | Not Switching |

TABLE I-continued

| Architecture | Delay through level down shifter circuit 100 | Duty Cycle Out (VDD-LO = 0.63 V to 1.0 V) | Duty Cycle Out (VDD-LO = 0.54 V to 1.0 V) |
| --- | --- | --- | --- |
| Level down shifter circuit 100 | 337 ps | 48-52% | 48-52% |
| Change | −56.5% | | |

Table II shows that the propagation delay through the down shifting is decreased by over half due to the incorporation of the assist circuit 126. For a core voltage of VDD-LO=0.63 to 1.0 volts, the level down shifter circuit 100 generates a more symmetrical "square" wave in the digital shifted signal SFT than the common level shifter. For a core voltage VDD-LO down to 0.54 volts, the level down shifter circuit 100 continues to perform the same as at higher core voltages VDD-LO whereas the common level shifter fails to switch the digital shifted signal SFT in response to the square wave in the digital input signal IN.

Figure 9:
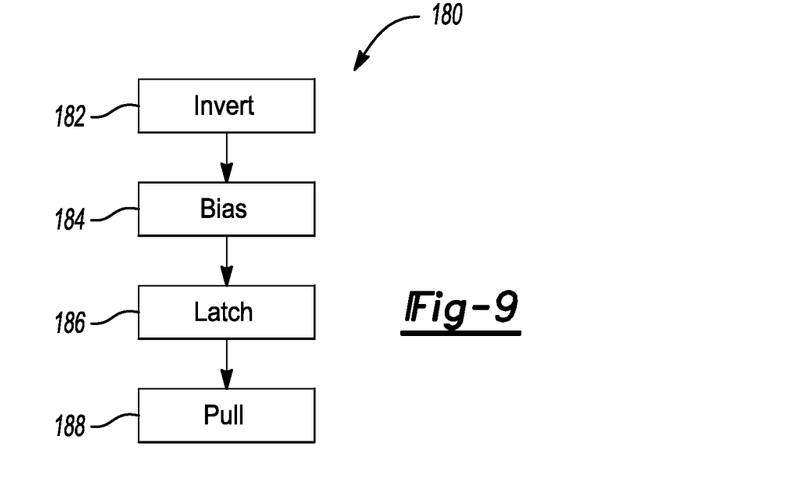
FIG. 9 is a flow diagram of a method of operation for the level down shifter circuit in accordance with an exemplary embodiment.

Referring to FIG. 9, a flow diagram of an example method 180 of operation for the level down shifter circuit 100 is shown in accordance with an exemplary embodiment. The method (or process) 180 includes a step 182, a step 184, a step 186, and a step 188. The sequence of steps is shown as a representative example. Other step orders may be implemented to meet the criteria of a particular application.

In the step 182, the inverter 122 inverts the digital input signal IN to create the complementary input signal INB. The header 120 biases the intermediate node 114 of the shifter circuit 124 in the step 184 to the intermediate voltage (e.g., the signal INT) in the second voltage domain. In the step 186, the latch 128 generates the shifted output signal SFT and the complementary shifted signal SFTB by downshifting voltages of the digital input signal IN and the complementary input signal INB. The digital input signal IN and the complementary input signal INB are in the first voltage domain. The digital shifted signal SFT and the complementary shifted signal SFTB are in the second voltage domain. The second voltage domain has a smaller voltage range than the first voltage domain.

In the step 188, the assist circuit 126 alternately pulls the digital shifted signal SFT and the complementary shifted signal SFTB to the intermediate voltage (at the intermediate node 114) in response to the digital input signal IN and the complementary input signal INB. The intermediate voltage is in the second voltage domain. The digital shifted signal SFT may subsequently be presented through the digital output node 110 to the core logic 94.

Figure 10:
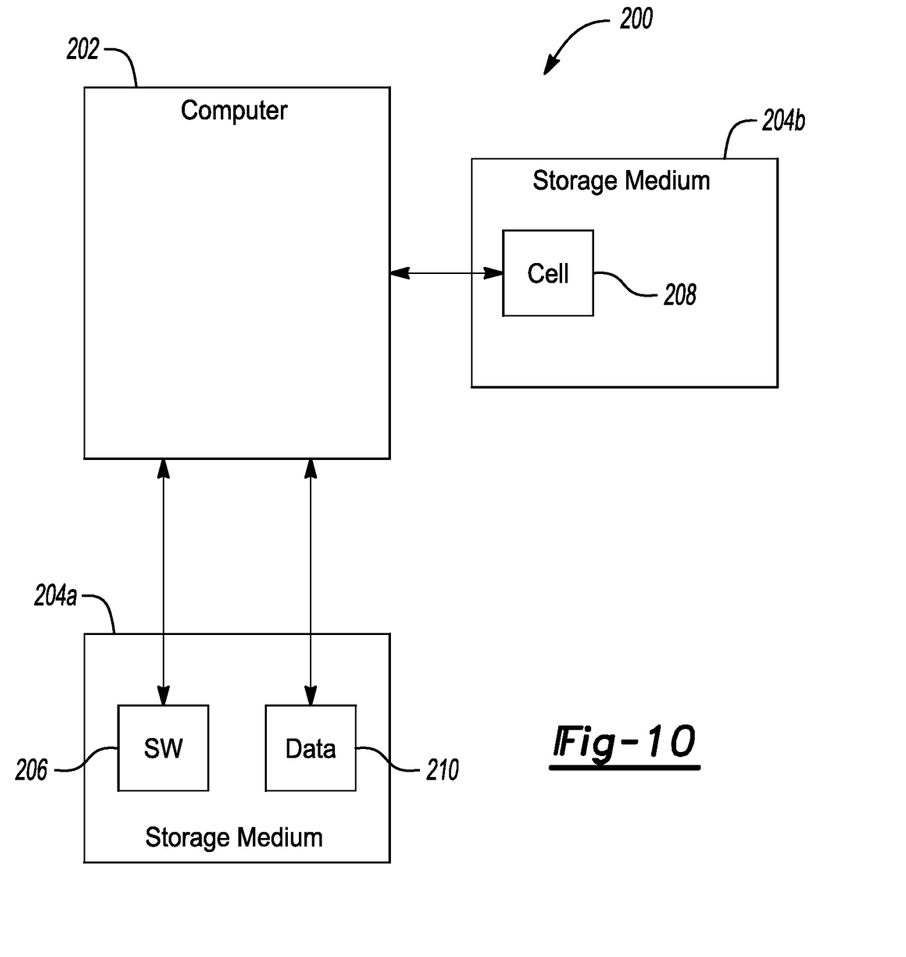
FIG. 10 is a schematic diagram of a computer system in accordance with an example embodiment.

Referring to FIG. 10, a schematic diagram of an example computer system 200 is shown in accordance with an example embodiment. The computer system 200 is operational to generate a library cell in a non-transitory computer readable storage. The library cell defines the level down shifter circuit 100 in software and stores the cell in a cell library for reuse in later design applications. Simulation models may also be created of the level down shifter circuit 100. Such models may be exercised by a simulator to verify proper functionality and performance of the designs.

The computer system 200 includes a computer 202 and one or more storage media 204a-204b. A first storage medium (e.g., 204a) may contain one or more software programs 206 readable and executable by the computer 202. The first storage medium 204a may also record a data file 210 that defines one or more designs of the level down shifter circuit 100. A library cell 208 that stores data defining one or more designs of the level down shifter circuit 100 may reside in a second storage medium (e.g., 204b).

The software program 206 may be read and executed by the computer 202 to implement the process of generating the library cell 208 for the level down shifter circuit 100. The data file 210 may be accessed as appropriate during execution. In various embodiments, the library cell 208 may include a number of views, including layout, schematic, symbol, abstract, other logical or simulation views, and timing of the level down shifter circuit 100. In some embodiments, the software program 206, the data file 210 and the library cell 208 may be stored in the same storage medium 204a or 204b.

In one or more embodiments, the level down shifter circuit includes a header configured to bias the intermediate voltage from a second voltage source of the second voltage domain.

In one or more embodiments, the header includes a transistor with a gate tied to a first voltage source of the first voltage domain.

In one or more embodiments, the level down shifter circuit includes an inverter configured to generate the complementary input signal by an inversion of the digital input signal.

In one or more embodiments of the level down shifter circuit, the assist circuit includes a first transistor coupled between the intermediate voltage and the digital shifted signal, and controlled by the digital input signal, and a second transistor coupled between the intermediate voltage and the complementary shifted signal, and controlled by the complementary input signal.

In one or more embodiments of the level down shifter circuit, the latch includes a plurality of thin-oxide p-channel metal-oxide-silicon transistors and a plurality of thick-oxide n-channel metal-oxide-silicon transistors.

In one or more embodiments of the level down shifter circuit, a response of the plurality of thin-oxide p-channel metal-oxide-silicon transistors is slower than the plurality of thick-oxide n-channel metal-oxide-silicon transistors where the second voltage domain is approximate a threshold voltage of the plurality of thin-oxide p-channel metal-oxide-silicon transistors.

In one or more embodiments of the level down shifter circuit the latch includes a plurality of transistors, and the second voltage domain is a core voltage domain less than a threshold voltage of the plurality of transistors.

In one or more embodiments of the level down shifter circuit, the first voltage domain spans a first voltage range between a reference voltage and approximately 1.0 volts to approximately 2.0 volts, and the second voltage domain spans a second voltage range between the reference voltage and approximately 0.54 volts to approximately 1.0 volts.

In one or more embodiments of the level down shifter circuit, the digital input signal has a maximum frequency in a range of approximately 10 megahertz to approximately 250 megahertz.

In one or more embodiments of the level down shifter circuit, a propagation delay through the latch is less than 350 picoseconds.

In one or more embodiments of the level down shifter circuit, the latch and the assist circuit form part of an integrated circuit.

In one or more embodiments, the method includes biasing the intermediate voltage from a voltage source of the second voltage domain.

In one or more embodiments, the method includes generating the complementary input signal by inverting the digital input signal.

In one or more embodiments of the method, the alternately pulling of the digital shifted signal and the complementary shifted signal to the intermediate voltage includes pulling the digital shifted signal to the intermediate voltage under control of the digital input signal, and pulling the complementary shifted signal to the intermediate voltage under control of the complementary input signal.

In one or more embodiments of the method, the second voltage domain is a core voltage domain less than a threshold voltage of a plurality of transistors used to downshift voltages of the digital input signal and the complementary input signal.

In one or more embodiments of the non-transitory computer readable storage medium, the level down shifter circuit includes a header coupled to the assist circuit. The header is further configured to bias the intermediate voltage from a second voltage source of the second voltage domain.

In one or more embodiments of the non-transitory computer readable storage medium, the level down shifter circuit includes an inverter coupled to the latch and the assist circuit. The inverter is configured to generate the complementary input signal by an inversion of the digital input signal.

While the best modes for carrying out the disclosure have been described in detail, those familiar with the art to which this disclosure relates will recognize various alternative designs and embodiments for practicing the disclosure within the scope of the appended claims.

What is claimed is:

1. A level down shifter circuit comprising:
   a latch configured to generate a digital shifted signal and a complementary shifted signal by a voltage downshift of a digital input signal and a complementary input signal, wherein the digital input signal and the complementary input signal are in a first voltage domain, the digital shifted signal and the complementary shifted signal are in a second voltage domain, and the second voltage domain has a smaller voltage range than the first voltage domain;
   an assist circuit configured to alternately pull the digital shifted signal and the complementary shifted signal to an intermediate voltage in response to the digital input signal and the complementary input signal, wherein the intermediate voltage is in the second voltage domain; and
   a header configured to bias the intermediate voltage from a second voltage source of the second voltage domain.

2. The level down shifter circuit according to claim 1, wherein the header includes a transistor with a gate tied to a first voltage source of the first voltage domain.

3. The level down shifter circuit according to claim 1, further comprising an inverter configured to generate the complementary input signal by an inversion of the digital input signal.

4. The level down shifter circuit according to claim 1, wherein the assist circuit includes:
   a first transistor coupled between the intermediate voltage and the digital shifted signal, and controlled by the digital input signal; and
   a second transistor coupled between the intermediate voltage and the complementary shifted signal, and controlled by the complementary input signal.

5. The level down shifter circuit according to claim 1, wherein the latch includes a plurality of thin-oxide p-channel metal-oxide-silicon transistors and a plurality of thick-oxide n-channel metal-oxide-silicon transistors.

6. The level down shifter circuit according to claim 5, wherein a response of the plurality of thin-oxide p-channel metal-oxide-silicon transistors is slower than the plurality of thick-oxide n-channel metal-oxide-silicon transistors where the second voltage domain approximate matches a threshold voltage of the plurality of thin-oxide p-channel metal-oxide-silicon transistors.

7. The level down shifter circuit according to claim 1, wherein the latch includes a plurality of transistors, and the second voltage domain is a core voltage domain that is less than a threshold voltage of the plurality of transistors.

8. The level down shifter circuit according to claim 1, wherein the first voltage domain spans a first voltage range between a reference voltage and approximately 1.0 volts to approximately 2.0 volts, and the second voltage domain spans a second voltage range between the reference voltage and approximately 0.54 volts to approximately 1.0 volts.

9. The level down shifter circuit according to claim 1, wherein the digital input signal has a maximum frequency in a range of approximately 10 megahertz to approximately 250 megahertz.

10. The level down shifter circuit according to claim 1, wherein a propagation delay through the latch is less than 350 picoseconds.

11. The level down shifter circuit according to claim 1, wherein the latch and the assist circuit form part of an integrated circuit.

12. The level down shifter circuit according to claim 1, wherein the header includes a resistor coupled to the second voltage source.

13. A method for level down shifting comprising:
   generating a digital shifted signal and a complementary shifted signal by downshifting voltages of a digital input signal and a complementary input signal using a circuit, wherein the digital input signal and the complementary input signal are in a first voltage domain, the digital shifted signal and the complementary shifted signal are in a second voltage domain, and the second voltage domain has a smaller voltage range than the first voltage domain;
   alternately pulling the digital shifted signal and the complementary shifted signal to an intermediate voltage in response to the digital input signal and the complementary input signal, wherein the intermediate voltage is in the second voltage domain; and
   biasing the intermediate voltage from a voltage source of the second voltage domain.

14. The method according to claim 13, further comprising:
   generating the complementary input signal by inverting the digital input signal.

15. The method according to claim 13, wherein the alternately pulling of the digital shifted signal and the complementary shifted signal to the intermediate voltage includes:
   pulling the digital shifted signal to the intermediate voltage under control of the digital input signal; and
   pulling the complementary shifted signal to the intermediate voltage under control of the complementary input signal.

16. The method according to claim 13, wherein the second voltage domain is a core voltage domain that is less than a threshold voltage of a plurality of transistors used to downshift voltages of the digital input signal and the complementary input signal.

17. The method according to claim 13, further comprising:

limiting a current in the biasing of the intermediate voltage.

18. A non-transitory computer readable storage medium storing a library cell defining a level down shifter circuit, the level down shifter circuit comprising:

a digital input node;

a complementary input node;

a digital output node;

an intermediate node;

a latch coupled to the digital input node, the complementary input node, and the digital output node, the latch being configured to generate a digital shifted signal on the digital output node and a complementary shifted signal on a complementary shifted node by a voltage downshift of a digital input signal on the digital input node and a complementary input signal on the complementary input node, wherein the digital input signal and the complementary input signal are in a first voltage domain, the digital shifted signal and the complementary shifted signal are in a second voltage domain, and the second voltage domain has a smaller voltage range than the first voltage domain;

an assist circuit coupled to the digital input node, the complementary input node, the digital output node, and the complementary shifted node, the assist circuit being configured to alternately pull the digital shifted signal and the complementary shifted signal to an intermediate voltage on the intermediate node in response to the digital input signal and the complementary input signal, wherein the intermediate voltage is in the second voltage domain; and a header configured to bias the intermediate voltage from a second voltage source of the second voltage domain.

19. The non-transitory computer readable storage medium according to claim 18, wherein the level down shifter circuit further comprises an inverter coupled to the latch and the assist circuit, and the inverter is configured to generate the complementary input signal by an inversion of the digital input signal.

20. The non-transitory computer readable storage medium according to claim 18, wherein the header includes a transistor with a gate tied to a first voltage source of the first voltage domain.

21. The non-transitory computer readable storage medium according to claim 18, wherein the header includes a resistor coupled to the second voltage source.

* * * * *